(12) United States Patent
Kim

(10) Patent No.: US 7,698,680 B2
(45) Date of Patent: Apr. 13, 2010

(54) ENGINEERING CHANGE ORDER CELL AND METHOD FOR ARRANGING AND ROUTING THE SAME

(75) Inventor: Min Hwahn Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 482 days.

(21) Appl. No.: 11/646,435

(22) Filed: Dec. 28, 2006

(65) Prior Publication Data

US 2007/0157151 A1 Jul. 5, 2007

(30) Foreign Application Priority Data

Dec. 29, 2005 (KR) .................... 10-2005-0134080

(51) Int. Cl.
G06F 17/50 (2006.01)
H01L 29/80 (2006.01)
H01L 21/8238 (2006.01)

(52) U.S. Cl. .............................. 716/13; 716/2; 716/11; 716/17; 257/204; 257/206; 257/209; 438/199

(58) Field of Classification Search .................... 716/2, 716/11, 13, 17; 438/199; 257/204, 206, 257/209, 516, 678
See application file for complete search history.

(56) References Cited

U.S. PATENT DOCUMENTS

| | | | | |
|---|---|---|---|---|
| 5,814,844 A | * | 9/1998 | Nagata et al. | 257/206 |
| 6,372,291 B1 | * | 4/2002 | Hua et al. | 427/255.28 |
| 6,453,454 B1 | * | 9/2002 | Lee et al. | 716/11 |
| 7,034,384 B2 | * | 4/2006 | Tsai | 257/678 |
| 7,137,094 B2 | * | 11/2006 | Tien | 716/11 |
| 7,183,594 B2 | * | 2/2007 | Hartwig | 257/204 |
| 7,441,211 B1 | * | 10/2008 | Gupta et al. | 716/2 |
| 2006/0199325 A1 | * | 9/2006 | Maeno et al. | 438/199 |
| 2007/0045770 A1 | * | 3/2007 | Aoki | 257/516 |
| 2008/0029786 A1 | * | 2/2008 | Fan | 257/209 |

FOREIGN PATENT DOCUMENTS

JP 2007067207 A * 3/2007

* cited by examiner

Primary Examiner—Helen Rossoshek
(74) Attorney, Agent, or Firm—Finnegan, Henderson, Farabow, Garrett & Dunner, L.L.P.

(57) ABSTRACT

There is provided an engineering change order (ECO) cell, which includes: a function circuit including at least one PMOS transistor with a P-diffusion layer and a first poly gate, at least one NMOS transistor with an N-diffusion layer and a second poly gate; a first power layer supplying the at least one PMOS transistor with a first power voltage; and a second power layer supplying the at least one NMOS transistor with a second power voltage. The first poly gate of the PMOS transistor is isolated from the second poly gate of the NMOS transistor.

11 Claims, 5 Drawing Sheets

ENGINEERING CHANGE ORDER CELL AND METHOD FOR ARRANGING AND ROUTING THE SAME

RELATED APPLICATION

This application is based upon and claims the benefit of priority to Korean Application No. 10-2005-0134080 filed on Dec. 29, 2005, the entire contents of which are incorporated herein by reference.

BACKGROUND

1. Technical Field

The present invention relates to an engineering change order (ECO) cell and a method for arranging and routing the same.

2. Description of the Related Art

A standard cell type LSI design engineering is widely used as a layout design engineering for implementing a large scale integrated circuit (LSI) having high integration on a semiconductor substrate for a short period of time. In the standard cell type LSI design engineering, a small unit circuit, such as an inverter and a NAND gate, is prepared as the standard cell, and the standard cell is arranged in array form and is connected to each other to form the LSI.

Hereinafter, an ECO cell in accordance with the related art will be described in more detail with reference to the accompanying drawings.

FIG. 1 shows a layout of a standard cell type LSI in accordance with the related art, and FIG. 2 shows an inner pattern view of a standard cell in accordance with the related art.

As shown in FIG. 1, a plurality of cell arrays are arranged, and each of cell arrays is formed by a plurality of standard cell 1006 having the same width (in other words, depth in drawings) and is arranged in array form.

A routing channel 1801 is arranged between the neighboring standard cell arrays. An inner-cell connection unit 1802 for connection between standard cells is included in the same standard cell array and an inter-array connection unit 1803 for connection between standard cells is included in different standard cell arrays which are located on routing channel 1801.

An ECO cell is provided in a design based on the standard cell library

The ECO cell in accordance with the related art will be described in more detail with reference to FIG. 2.

As shown in FIG. 2, ECO cell 200 includes a VDD power layer 202 for a VDD power supply, an N-diffusion layer 205 for a pick-up and a first contact hole 204, which connects VDD power layer 202 with N-diffusion layer 205, in an N-well 201.

A lower side of ECO cell 200 includes a VSS power layer 211 for a VSS power supply, a P-diffusion layer 210 for a pick-up and a second contact hole 209, which connects VSS power layer 211 with P-diffusion layer 210, and has an N-diffusion layer 208 and a poly gate 206 for making an NMOS included in various circuits.

Here, the NMOS poly gate and the PMOS poly gate are formed to be a single body.

However, the ECO cell in accordance with the related art has a problem as described below.

As described above, in the case that the cell library is used in the ECO cell, since a size of the cell library is predetermined, the flexibility is limited in a place step of the standard cell. Moreover, since a junction capacitance of the transistor is increased, the performance of the cell library used in the ECO cell will not be good.

In detail, since the ECO cell library having a fixed width is adapted in a cell library layout and a grid based auto place and root (P&R) tool is adapted, the flexibility of a cell layout is lowered.

Moreover, a connection between the PMOS of the ECO cell and the gate electrode of the NMOS is limited to generate various logic functions.

Accordingly, it is limited to respond to a request of a designer.

BRIEF SUMMARY

Consistent with the present invention there is provided an ECO cell in a standard cell library-based design, particularly, to provide an ECO cell and a method for arranging and routing the ECO cell, which can reduce junction capacitance and obtain flexibility in an auto plate and root (P&R) tool by separately forming the poly gate of the PMOS transistor and the poly gate of the NMOS transistor.

Consistent with the present invention, there is provided an engineering change order (ECO) cell, which includes: a function circuit including at least one PMOS transistor with a P-diffusion layer and a first poly gate; at least one NMOS transistor with an N-diffusion layer and a second polygate; a first power layer supplying the at least one PMOS transistor with a first power voltage; and a second power layer supplying the at least one NMOS transistor with a second power voltage. The first poly gate of the PMOS transistor is isolated from the second poly gate of the NMOS transistor.

Also, consistent with the present invention, there is provided a method for arranging and routing an engineering change order (ECO) cell, comprising: routing a previously fabricated logic function cell on a wafer; confirming a use of a library of a wafer which is not passed on a test; re-routing a previously fabricated ECO cell if the library is capable of being used; and testing the wafer.

DETAILED DESCRIPTION

Consistent with the present invention there is provided an ECO cell in a design based on a standard cell library. In general, processes for a plurality of layers are again performed to fabricate a chip on a silicon wafer by the ECO.

However, it is required that the number of re-processed layers is reduced to save total cost. Consistent with the present invention, it is proposed to minimize the number of re-processes.

Meanwhile, in a grid-based auto plate and root (P&R) tool, a P&R transient time is reduced by providing the ECO cell by one-grid unit (e.g., a size of the cell is four-grid, five-grid, and six-grid) such that the burden of a cell layout may be minimized.

Generally, in the case of fabricating the ECO cell, a designer uses logic functions (e.g., inverter, NAND, NOR, Exclusive-Nor, Exclusive-OR, AND, OR, AOI, OAI, and Latch Flip-flop) by preparing the logic functions beforehand. However, when it is necessary to perform a complicated Boolean function under the specific circumstance, if the logic functions are not prepared, the ECO cell cannot be used, so all masks must be fabricated again, causing an increase to the manufacturing cost. Consistent with the present invention, the above problem is solved by providing an extra ECO cell.

Consistent with the present invention fabricating a high performance ECO cell by minimizing capacitance components in drain or source terminals of a transistor when fabricating the ECO may be achieved.

To this end, a gate isolation method is used.

Moreover, the size of the ECO cell in accordance with the related art is increased by a diffusion spacing rule. In contrast, consistent with the present invention, adjacent cells can be isolated through the gate isolation method, so the diffusion spacing for isolating cells or transistors from each other is not required, so that a desired cell may be obtained within a small size.

Hereinafter, an ECO cell and a method for arranging and routing the same in accordance with a preferred embodiment consistent with the present invention will be described in more detail with reference to the accompanying drawings.

Figure 1:
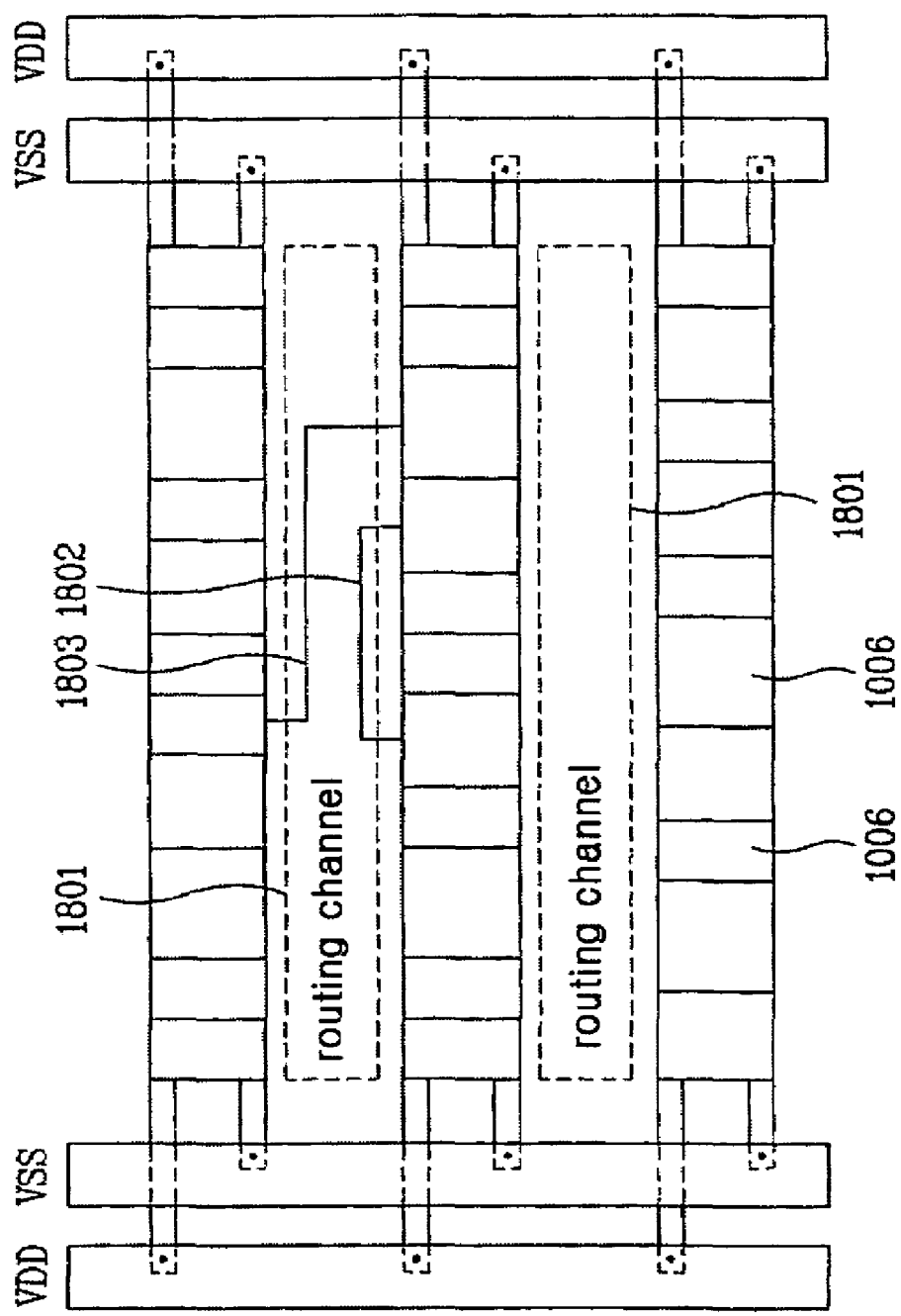
FIG. 1 shows a layout of a standard cell type LSI in accordance with the related art.
Figure 2:
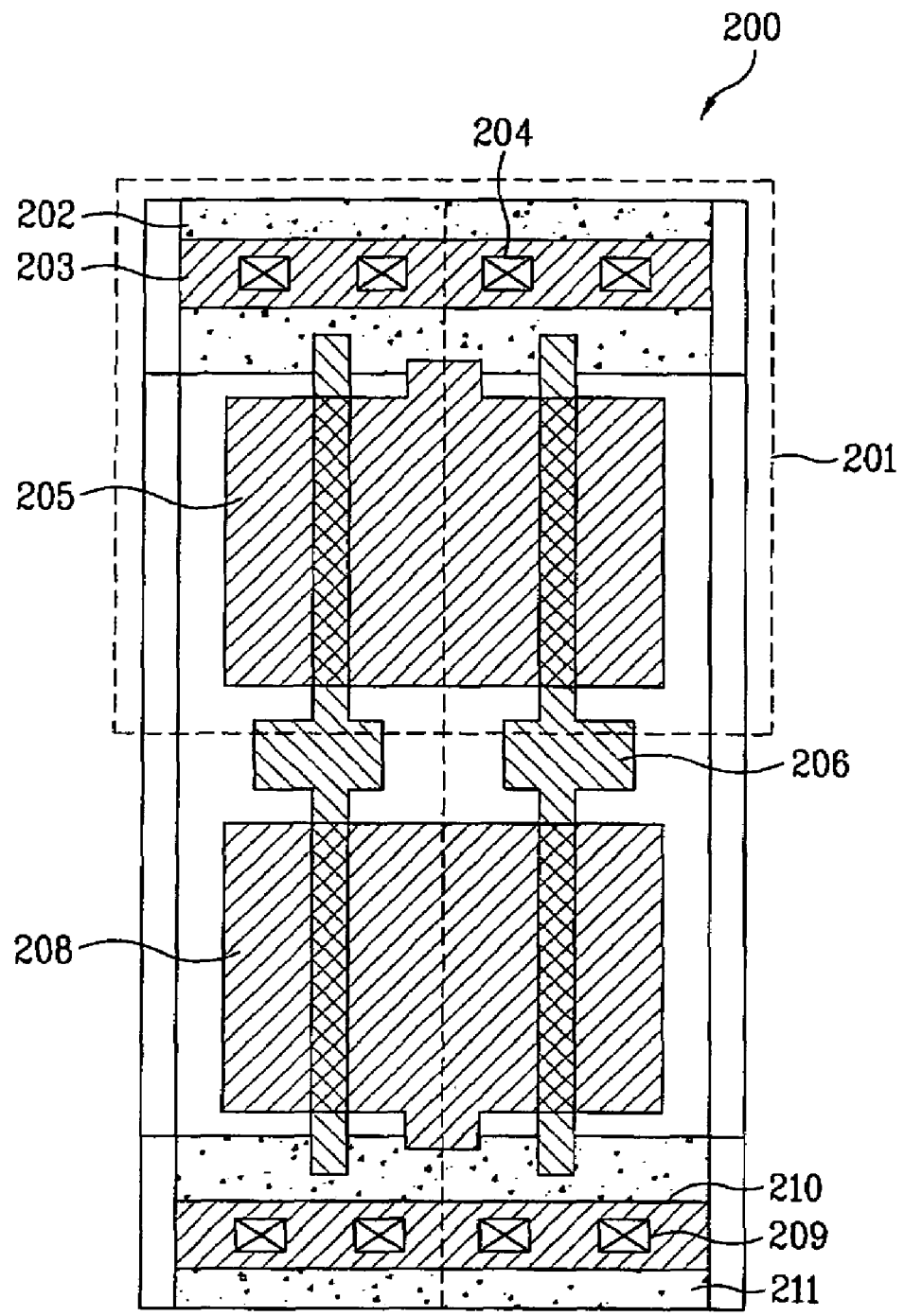
FIG. 2 shows a pattern view of a standard cell in accordance with the related art.
Figure 3:
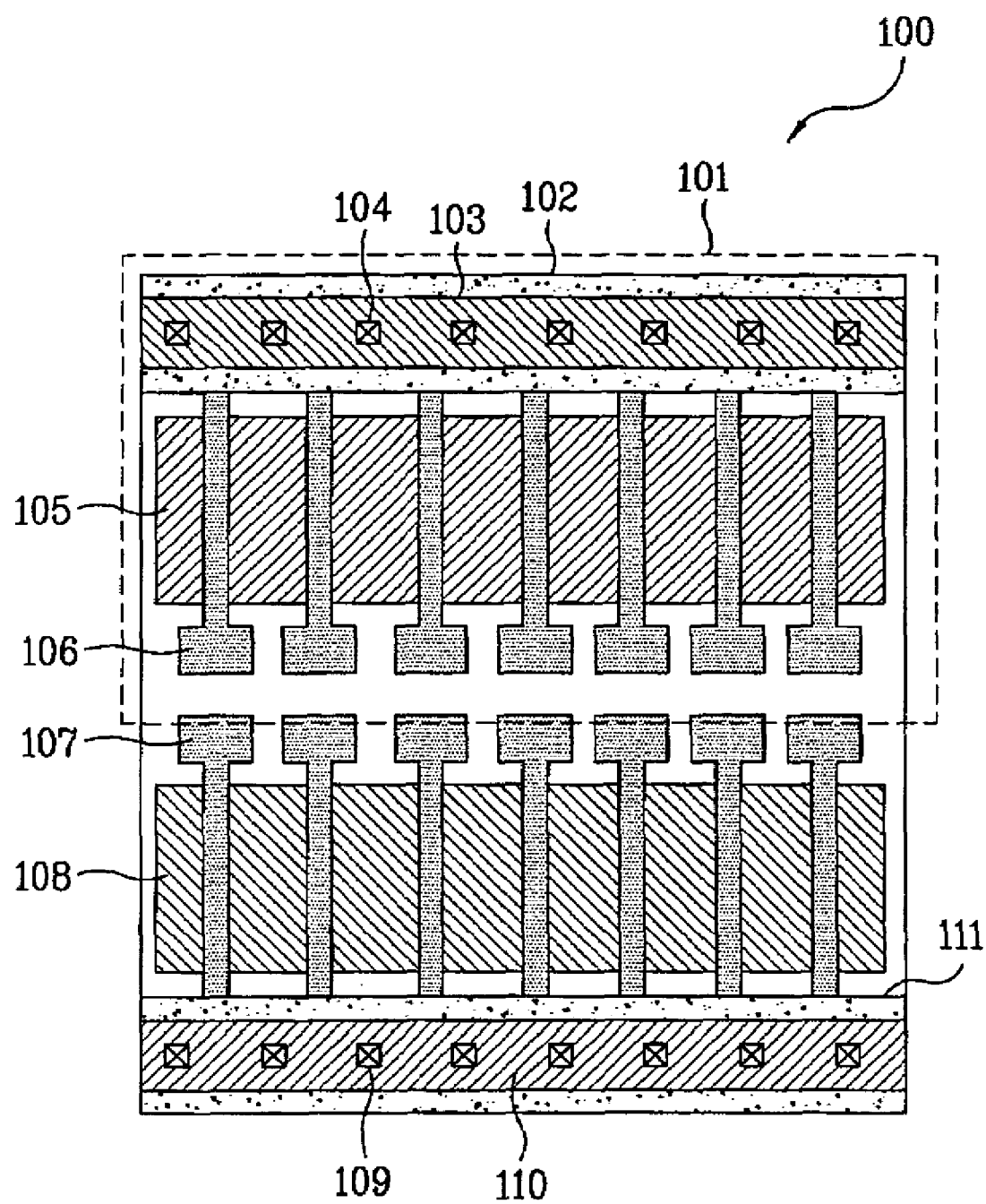
FIG. 3 is a top view showing an inner pattern of an ECO cell in accordance with a first embodiment consistent with the present invention.
Figure 4:
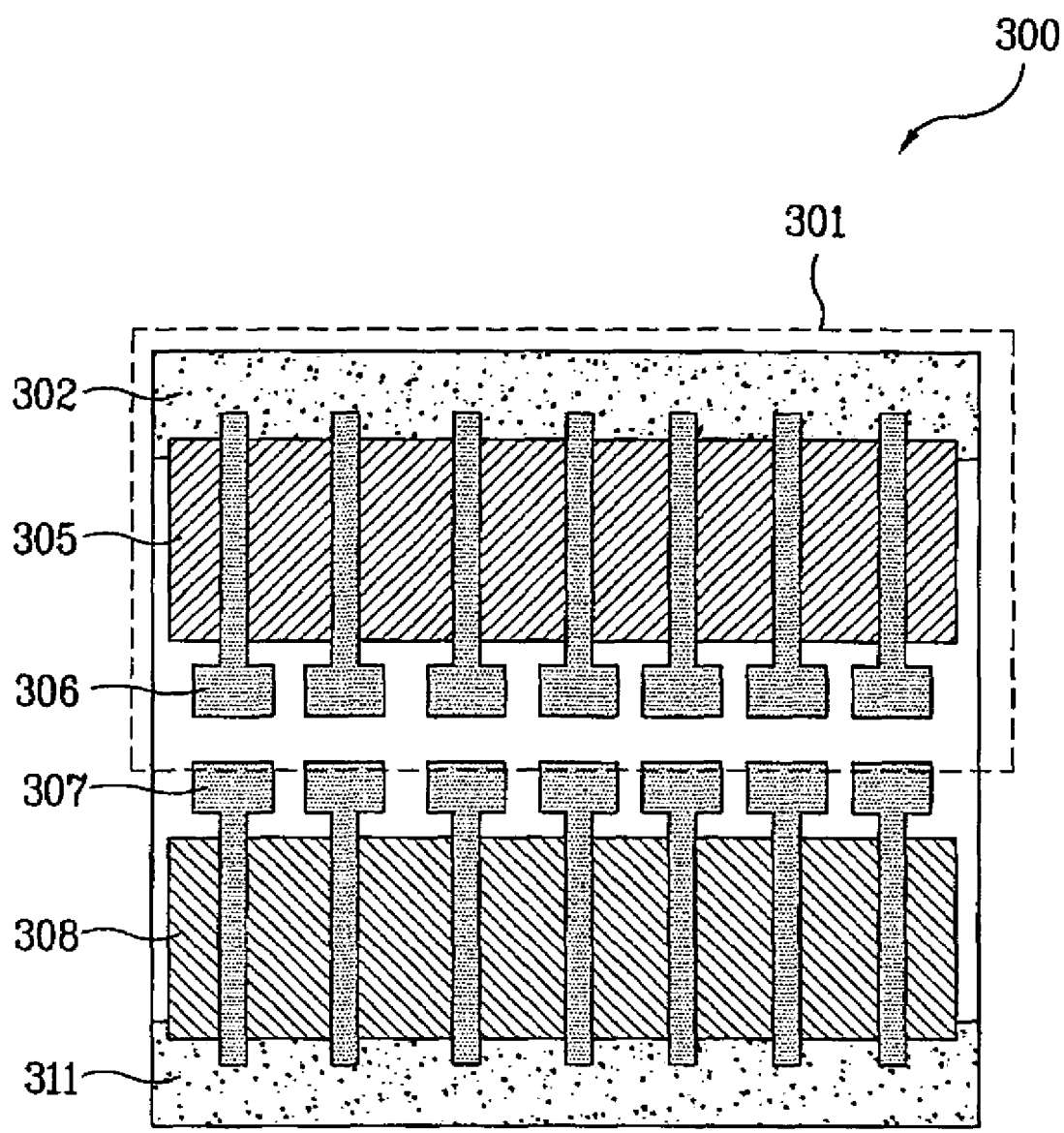
FIG. 4 is a top view showing an inner pattern of an ECO cell in accordance with a second embodiment consistent with the present invention.

FIG. 3 is a top view showing an inner pattern of an ECO cell in accordance with a first embodiment consistent with the present invention, and FIG. 4 is a top view showing an inner pattern of an ECO cell in accordance with a second embodiment consistent with the present invention.

The ECO cell consistent with the present invention is a continuous diffusion type ECO cell having a continuous inner diffusion layer and is used in a design using a standard cell library.

That is, the previously fabricated logic function cells are arranged and the ECO cell consistent with the present invention is used in re-routing an element having the logic function cells.

ECO cell 100 in accordance with a first embodiment consistent with the present invention having the same height with a standard cell, as shown in FIG. 3, includes a VDD power layer 102, an N-diffusion layer 103 for pick up, and a first contact hole 104. VDD power layer 102 may be formed of a metal material, and may be formed in an N-well 101 and provides VDD power. First contact hole 104 connects VDD power layer 102 with N-diffusion layer 103. A P-diffusion layer 105 and a first poly gate 106 for fabricating a PMOS to configure various circuits are further included in ECO cell 100.

The lower side of ECO cell 100 includes a VSS power layer 111, which may be formed of a metal material, and provides VSS power. The lower side of ECO cell 100 further includes a P-diffusion layer 110 for pick up, and a second contact hole 109 which connects VSS power layer 111 and P-diffusion layer 110. An N-diffusion layer 108 and a second poly gate 107 for fabricating an NMOS to configure various circuits are further included in the lower side of ECO cell 110.

Here, a P-channel MOS transistor having a source and a drain formed by P-diffusion layer 105 is formed in an N-well 101, and an N-channel MOS transistor having a source and a drain formed by N-diffusion layer 108 is formed on a P-type substrate region of an outer N-well 101.

In the case of the ECO cell consistent with the present invention, all cells have an identically uniform width, and the VDD power layer and the VSS power layer having the same fixed width are located on an upper part and a lower part. In particular, first poly gate 106 of the PMOS and second poly gate 107 of the NMOS are isolated from each other.

In particular, a continuous diffusion type ECO cell consistent with the present invention may easily arrange cells in auto plate and root (P&R) tool by fabricating a plurality of cells having a width equivalent to a multiple of the grid for a grid based layout system.

FIG. 3 illustrates an embodiment of the ECO cell including seven continuous transistors.

Accordingly, the number of transistors for the ECO cell may be increased by increasing a width of the ECO cell by one-grid unit.

The width of the ECO cell consistent with the present invention may be adjusted by one-grid unit.

Moreover, various circuits are implemented by adapting a gate isolation method, which isolates left/right circuits by applying the VSS to second poly gate 107 of the NMOS transistor and applying the VDD to first poly gate 106 of the PMOS transistor, to the PMOS and the NMOS respectively.

The NMOS and PMOS transistors are arrayed in a finger type, and apply a ground voltage GND to the VSS power layer for being connected with a power in an arrangement with a general standard cell.

The ECO cell may be previously fabricated or newly fabricated and used. The ECO cell may be designed by the same layout with the standard cell.

The ECO cell may be arranged on a void space on which the standard cell is not arranged, and may be arranged on a part of an element such as an SOG.

In another embodiment, the diffusion layer for pick-up may be removed in FIG. 3. ECO cell 300 in accordance with a second embodiment consistent with the present invention, as shown in FIG. 4, includes a VDD power layer 302 and a PMOS transistor in N-well 301. VDD power layer 302 is formed on an upper end of ECO cell 300 by a metal material, and provides the VDD power.

The PMOS transistor includes first poly gate 306 and source and drain regions formed by P-diffusion layer 305.

A contact hole connecting the VDD power layer with the N-diffusion layer is not formed by not forming the N-diffusion layer for pick-up.

A lower side of the ECO cell includes a VSS power layer 311 and an NMOS transistor. VSS power layer 311 is formed on a lower end of the ECO cell by a metal material and provides the VSS power.

The NMOS transistor includes a second poly gate 307 and source and drain regions formed by N-diffusion layer 308.

The P-diffusion layer for pick-up and a contact hole connecting the VSS power layer to the P-diffusion layer are not formed.

The ECO cell may or may not have the N-diffusion layer and the P-diffusion layer for pick-up such as a general standard cell. In the case that the ECO cell does not have the diffusion layer for pick-up, the ECO cell does not provide the well with a power without the diffusion layer for pick-up.

A part or all of design supports a variable threshold CMOS (VTCMOS) or a specific characteristic such as a multi-VDD by providing the ECO cell on which the diffusion layer for pick-up is removed.

Figure 5:
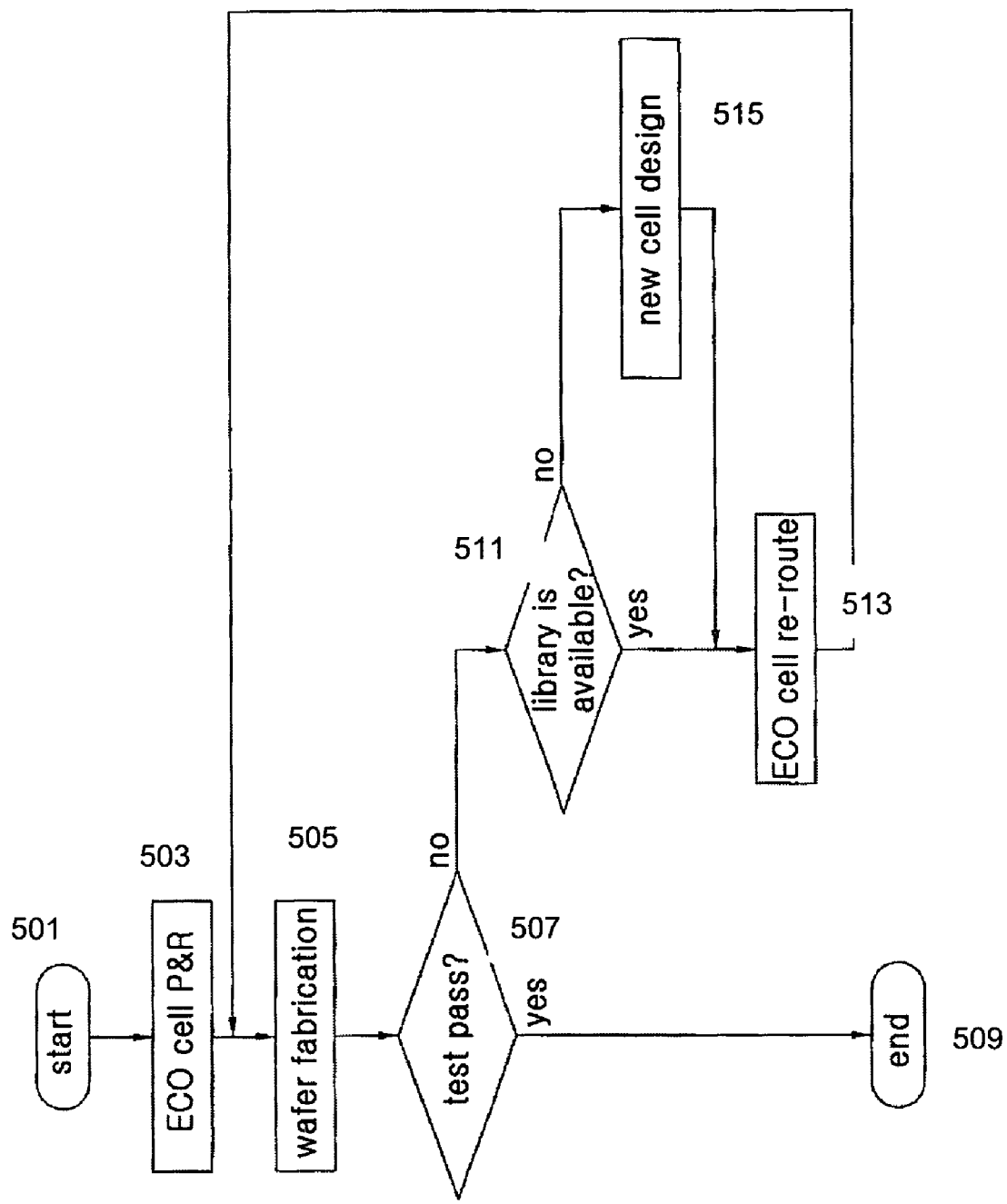
FIG. 5 is a design flow diagram which applies the ECO cell consistent with the present invention to a real design flow.

First, a design flow diagram which applies the ECO cell consistent with the present invention to a real design flow (501), as shown in FIG. 5, performs an auto plate and root (P&R) tool process for the ECO cell (503) or a logic function cell on a wafer, and fabricating the wafer (505) by performing a contact process and a layer process.

The fabricated wafer is tested, if the fabricated wafer is passed on the test (507), the test is terminated (509), and if the fabricated wafer is not passed on the test, the use of a library is checked (511).

If the library may be used, a previously fabricated ECO cell is re-routed and the wafer fabricating process is repeated (513).

If the library is not used, new cell is designed based on the CEO cell, and the newly designed cell is re-routed, and then the wafer fabricating process is repeated (515).

As described above, simple logic function cells, such as inverter, NAND, NOR, or Flip-Flop, may be provided. However, if the designer wants to perform a complicated function, the designer may directly implement complicated Boolean function based on the previously arranged ECO cell.

Meanwhile, the ECO cell consistent with the present invention may minimize capacitance of the drain and source terminals of the transistor by using continuous diffusion and gate isolation, so that it can improve the performance of the complicated Boolean function cell and may be implemented in a small area.

In the case where the ECO cell consistent with the present invention is arranged, for instance, in a sea of gate (SOG) array on a certain region of a chip, logic blocks which are omitted on a large scale at the time of an initial design can be easily arranged.

As described above, the ECO cell, and methods for arranging and routing the ECO cell consistent with the present invention have the following advantages.

The ECO cell consistent with the present invention implements an intended cell in a smaller size without the diffusion spacing for isolation between cells or transistors by isolating neighboring cells based on the gate isolation method.

The ECO cell consistent with the present invention can minimize capacitance of the drain and source terminals of the transistor by using the continuous diffusion and the gate isolation.

Accordingly, the cell performance is improved.

Various logic functions can be generated by isolating the PMOS of the ECO cell from the poly gate of the NMOS.

Accordingly, the complicated boolean function can be executed rapidly and easily.

When changing a design, the use of a mask is reduced by reducing the number of layers to be changed.

A total design methodology has flexibility.

It will be apparent to those skilled in the art that various changes and modifications may be made without departing from the spirits and scope of the invention as defined in the following claims.

What is claimed is:

1. An engineering change order (ECO) cell comprising:
   a function circuit including at least one PMOS transistor with a P-diffusion layer and a first poly gate, at least one NMOS transistor with an N-diffusion layer and a second poly gate;
   a first power layer supplying the at least one PMOS transistor with a first power voltage; and
   a second power layer supplying the at least one NMOS transistor with a second power voltage, wherein the first poly gate of the PMOS transistor is isolated from the second poly gate of the NMOS transistor,
   wherein the width of the ECO cell is adjusted by one-grid unit.

2. The ECO cell according to claim 1, further comprising:
   an N-diffusion layer for pick-up formed on an upper part of the first power layer and contacting the first power layer.

3. The ECO cell according to claim 1, further comprising:
   a P-diffusion layer for pick-up formed on an upper part of the second power layer and contacting the second power layer.

4. The ECO cell according to claim 1, wherein the ECO cell is a continuous diffusion type cell having a continuous inner diffusion layer.

5. The ECO cell according to claim 1, wherein the ECO cell is designed by a similar process as a standard cell.

6. The ECO cell according to claim 1, wherein the ECO cell is previously fabricated or is newly fabricated.

7. The ECO cell according to claim 1, wherein the ECO cell is arranged on a part of element such as a sea of gate (SOG).

8. The ECO cell according to claim 1, wherein the ECO cell is arranged in a void space on which a standard cell is not arranged.

9. The ECO cell according to claim 1, wherein the NMOS transistor and the PMOS transistor are formed in a finger-type array.

10. The ECO cell according to claim 1, wherein a VDD power is provided through the first power layer and a VSS power is provided through the second power layer.

11. The ECO cell according to claim 1, wherein a VDD power is provided through the first power layer, and a ground voltage GND is provided through the second power layer.

* * * * *